(12) United States Patent
Guerel et al.

(10) Patent No.: US 10,396,456 B2
(45) Date of Patent: Aug. 27, 2019

(54) REDUCING NOISE IN PHASED-ARRAY SIGNALS FROM RECEIVERS LOCATED AT DIFFERENT LOCATIONS

(71) Applicant: International Business Machines Corporation, Armonk, NY (US)

(72) Inventors: Nezihe Merve Guerel, Rueschlikon (CH); Paul T. Hurley, Oberrieden (CH); Matthieu Martin Jean-Andre Simeoni, Lausanne (CH)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 15/254,208

(22) Filed: Sep. 1, 2016

(65) Prior Publication Data

US 2018/0062259 A1    Mar. 1, 2018

(51) Int. Cl.
| | | |
|---|---|---|
| *H01Q 3/00* | (2006.01) | |
| *H01Q 3/26* | (2006.01) | |
| *G01S 7/52* | (2006.01) | |
| *G01R 33/56* | (2006.01) | |
| *H01Q 3/34* | (2006.01) | |
| *G01S 15/89* | (2006.01) | |

(52) U.S. Cl.
CPC ......... *H01Q 3/267* (2013.01); *G01S 7/52077* (2013.01); *G01R 33/5608* (2013.01); *G01S 15/8915* (2013.01); *H01Q 3/34* (2013.01)

(58) Field of Classification Search
CPC ...... H01Q 3/267; H01Q 3/34; G01S 7/52077; G01S 15/8915
USPC .................................................. 342/371, 372
See application file for complete search history.

(56) References Cited

U.S. PATENT DOCUMENTS

| | | | | |
|---|---|---|---|---|
| 6,867,731 | B2 * | 3/2005 | Dizaji | G01S 7/292 |
| | | | | 342/159 |
| 7,199,753 | B2 * | 4/2007 | Pauplis | H01Q 3/267 |
| | | | | 342/174 |
| 7,415,063 | B1 * | 8/2008 | Ruffa | H04B 17/345 |
| | | | | 375/227 |

(Continued)

FOREIGN PATENT DOCUMENTS

WO    WO2008010787 A2    1/2008

OTHER PUBLICATIONS

Jonathan Gillard. Cadzows basic algorithm, alternating projections and singular spectrum analysis. Statistics and its interface, 3(3)335-343, 2010.

(Continued)

*Primary Examiner* — Chuong P Nguyen
(74) *Attorney, Agent, or Firm* — Daniel P. Morris; Otterstedt, Ellenbogen & Kammer, LLP

(57) ABSTRACT

In a computerized method to reduce noise in phased-array signals from a set of receivers at different locations, time-series are received from the receivers, which time-series form phased-array signals. The time-series are ordered based on the different locations of the receivers and spatially phased series are obtained from the ordered time-series. Each of the spatially phased series obtained includes a series of signal values that are spatially phased. A noise component is identified in each of the spatially phased series obtained and removed from the spatially phased series to obtain denoised series. Related receiver systems and computer program products are also provided.

3 Claims, 7 Drawing Sheets

(56) References Cited

U.S. PATENT DOCUMENTS

| | | | | |
|---|---|---|---|---|
| 7,472,041 B2* | 12/2008 | Taenzer | ............... | H04R 3/005 |
| | | | | 702/104 |
| 7,683,620 B2 | 3/2010 | Lin | | |
| 8,232,799 B2* | 7/2012 | Hajian | ................ | G01R 33/56 |
| | | | | 324/309 |
| 8,244,493 B2* | 8/2012 | Dhanekula | .......... | G06F 11/0751 |
| | | | | 702/75 |
| 9,075,134 B2* | 7/2015 | Abe | ...................... | G01S 13/06 |
| 2006/0087475 A1* | 4/2006 | Struckman | ............. | G01S 5/04 |
| | | | | 342/451 |
| 2008/0272782 A1* | 11/2008 | Lin | .................... | G01R 33/482 |
| | | | | 324/312 |
| 2010/0332199 A1* | 12/2010 | Dhanekula | .......... | G06F 11/0751 |
| | | | | 703/2 |

OTHER PUBLICATIONS

Ying, Leslie and Liang, Zhi-Pei. Parallel MRI Using Phased Array Coils. Signal Processing Magazine, IEEE, 27(4):90-98, Jul. 2010 (Abstract only pp. 1-3).

Nina Golyandina and Anatoly Zhigljaysky. Singular Spectrum Analysis for time series. Springer Science & Business Media, 2013, pp. i-vii.

* cited by examiner

REDUCING NOISE IN PHASED-ARRAY SIGNALS FROM RECEIVERS LOCATED AT DIFFERENT LOCATIONS

BACKGROUND

The invention relates in general to computerized method to reduce noise in phased-array signals. It can in particular be applied to the fields of radio interferometry (to clean a sky image), magnetic resonance imaging or ultrasound imaging and, more generally, sensor networks.

A phased-array is an array of sensors (or, in certain applications, antennas) which preserves a specific direction-based relationship between the phases of the respective signals. Phased-arrays are used in numerous areas such as ultrasound, magnetic resonance imaging, radio astronomy, optics and many others. Typically, the thermal noise sensed by the sensors has high power relative to weak incoming signals. Current solutions to overcome this noise usually rely on the use of a sufficiently large number of sensors and extend the observation time so as to find the true signal hidden in the noise.

The following references will later be referred to:
Jonathan Gillard. Cadzows basic algorithm, alternating projections and singular spectrum analysis. *Statistics and its interface*, 3(3):335-343, 2010.
Nina Golyandina and Anatoly Zhigljaysky. *Singular Spectrum Analysis for time series*. Springer Science & Business Media, 2013.
Ying, Leslie and Liang, Zhi-Pei. Parallel MRI Using Phased Array Coils. *Signal Processing Magazine, IEEE*, 27(4):90-98, July 2010.

SUMMARY

According to a first aspect, the present invention is embodied as a computerized method to reduce noise in phased-array signals from a set of receivers at different locations. Time-series are received from the receivers, which time-series form phased-array signals. The time-series are ordered based on the different locations of the receivers and spatially phased series are obtained from the ordered time-series. Each of the spatially phased series obtained comprises a series of signal values that are spatially phased. A noise component is identified in each of the spatially phased series obtained and removed from the spatially phased series to obtain denoised series.

The spatially phased series as obtained before denoising from the ordered time-series, may comprise a series of signal values that are both spatially phased and time shifted. I.e., the ordering of the time-series may comprise selecting time-series elements corresponding to two or more time instances and ordering the time-series elements selected based on the different locations of the receivers. Thus, the spatially phased series obtained may comprise a series of signal values that correspond to signal sensed at two or more time instances.

In variants, the spatially phased series obtained for each time-instance comprise a series of signal values that are only spatially phased, where the phase difference solely occurs due to the different locations between the receivers. That is, the ordering of the time-series is performed for each time-instance of the time-series received, based on the different locations of the receivers, so that each of the spatially phased series obtained for each time-instance comprises a series of signal values that correspond to signal sensed at a same time instance.

The ordering of the time-series is preferably based on distances between the different locations of the receivers. For example, it may be performed by identifying a sequence of receivers, wherein an $n+1^{th}$ receiver of the sequence is the closest receiver from an $n^{th}$ receiver of the sequence, so as to minimize distances between locations corresponding to contiguous pairs of elements in each of the spatially phased series.

In embodiments, the noise component is identified and removed according to steps of a singular spectrum analysis. Preferably yet, such steps include a step of eliminating frequencies above a given threshold in singular-vectors of one of two disjoint sets of singular triples that comprises highest largest singular-values, prior to reconstruct an approximate de-noised, spatially phased series.

The receivers may for instance be radio astronomy antennas grouped in stations, radiofrequency coils of a magnetic resonance imaging system, transducers of an ultrasound apparatus, or, more generally, sensors of a sensor network. The receivers may for instance be devices of an Internet-of-Things network.

According to another aspect, the invention is embodied as a receiver system. The system comprises a set of receivers at different locations, wherein each of the receivers is configured to convert signals it receives into time-series. The system also comprises one or more noise reduction units connected to the receivers. Each noise reduction unit is configured to receive time-series from receivers and order the time-series based on the different locations of such receivers, to obtain spatially phased series. Each noise reduction unit is further configured to identify a noise component in each of the spatially phased series obtained and remove the identified noise component therefrom, consistently with principles of the present methods.

In embodiments, the receiver system is a radio interferometry system and the receivers are radio astronomy antennas that are grouped in stations in the system. Preferably, the system comprises at least one noise reduction unit per station. In variants, the receiver system can be a magnetic resonance imaging system (in which case the receivers are radiofrequency coils) or an ultrasound apparatus (in which case the receivers are transducers).

According to a final aspect, the invention can be embodied as a computer program product for reducing noise in phased-array signals from a set of receivers. The computer program product comprises a computer readable storage medium having program instructions embodied therewith, the program instructions being executable by a computerized system to cause to take steps according to the present methods.

Devices, apparatuses, systems, methods and computer program products embodying the present invention will now be described, by way of non-limiting examples, and in reference to the accompanying drawings.

BRIEF DESCRIPTION OF THE DRAWINGS

The accompanying drawings show simplified representations of devices, systems or apparatuses according to embodiments, or parts thereof. Similar or functionally similar elements in the figures have been allocated the same numeral references, unless otherwise indicated.

DETAILED DESCRIPTION

Figure 1:
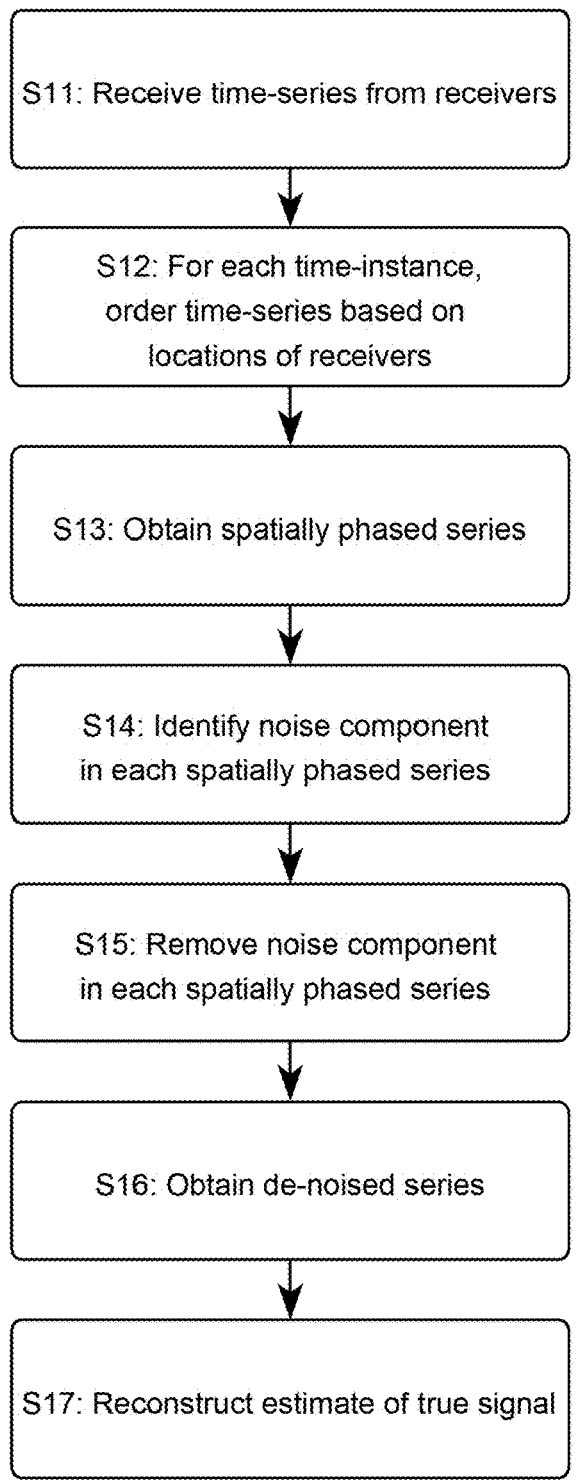
FIG. 1 is a flowchart illustrating high-level steps of a method for reducing noise in phased-array signals received from a set of receivers, according to embodiments.

The following description is structured as follows. First, general embodiments and high-level variants are described (sect. 1). Section 2 briefly exposes a modified singular spectrum analysis (SSA) technique used to denoise phased-array signals. Section 3 describes properties of embodiments of the invention. Section 4 addresses particular embodiments, in detail. The last section (sect. 5) is directed to technical implementation details of some embodiments.

1. General Embodiments and High-Level Variants

In reference to FIGS. 1, and 4-6, an aspect of the invention is first described, which concerns a computerized method for reducing noise in phased-array signals received from a set of receivers 410, 510, 610 that are located at different locations.

The method can for instance be implemented in a general-purpose or dedicated computerized system, in a centralized fashion or in a partly or fully delocalized manner. According to this method, time-series are received (step S11, FIG. 1) from the receivers 410, 510, 610. The receivers may notably be radio astronomy antennas of a radio interferometry system, radiofrequency coils of a magnetic resonance imaging (MRI) system, transducers of an ultrasound apparatus, or, more generally, sensors of a sensor network, as discussed later in reference to FIGS. 4-6. Each receiver senses a signal at each time instance and is able to produce a sensed signal value for each time instance, such that time series can be received from the receivers. Altogether, the time-series form phased-array signals. Phased-array signals are known per se.

According to the present methods, the time-series are re-ordered. Namely, the time-series received S11 are ordered S12 based on the different locations of the receivers 410, 510, 610. This makes it possible to obtain S13 spatially phased series, which comprise, each, a series of signal values (i.e., elements) that are spatially phased. That is, elements in each series are spatially phased according to an outcome of step S12. The phase difference occurs due to the different locations of receivers. Yet, such elements may further be explicitly time shifted, i.e., by explicitly incorporating a time shift in the signal values (or elements) of each series, as explained later in detail.

Next, a noise component is identified S14 in each of the spatially phased series obtained S13, so that the identified noise components can be removed S15 from the spatially phased series. Eventually, denoised series are obtained S16, which are spatially phased, from which estimates of the true signal can be reconstructed.

The apparent order of the above steps does not necessarily represent the order in which these steps will actually be performed, in operation. For instance, one may preferably want to perform the ordering S12 during a built-time, e.g., once for all, so that the spatially phased series subsequently obtained S13 may all obey a same order. Of course, the underlying system may be configured to allow some re-ordering, from times to times.

The above solution allows the noise in phased-arrays to be significantly and faithfully reduced, even in presence of very high instrumental noise, as present inventors have observed. Examples will be given throughout the description. While prior art denoising solutions for phased-array signals typically act on a large set of sensors and extend the observation time, the present solution de-noises the time-series directly from the receivers, thus increasing substantially the accuracy of results. Conversely, the present solution can also enable the reduction of the number of receivers and/or measurements required, thus potentially reducing substantially the cost of building a phased-array.

Embodiments of the invention find multiple applications, e.g., in magnetic resonance or ultrasound imaging (and more generally medical imaging), sensor networks, radio astronomy and interferometry, optical phased arrays, microphone arrays, etc., allowing various signal sources (stars and other wave sources, sounds, diseases, organs, etc.) to be observed. The present solution can also be applied to cognitive computing and internet of things technologies. The denoising methods discussed herein can further be thought of as unsupervised machine learning techniques, which may lead to potentially vastly improved data, learning images, features, etc. The present denoising techniques impact the number and robustness of sensors (notably, cheaper sensors can be used), which may for instance operate in an internet of things framework.

In embodiments, the spatially phased series obtained at step S13 may be both spatially phased and time shifted. I.e., the ordering S12 of the time-series may be performed by selecting time-series elements that correspond to two or more time instances and ordering the time-series elements selected based on the different locations of the receivers. Thus, the spatially phased series obtained S13 comprise a series of signal values that correspond to signal sensed at two or more time instances.

In simpler variants, however, the spatially phased series obtained at step S13 are only spatially phased, as exemplified below. I.e., the phase difference solely occurs due to the different locations between the receivers. That is, the ordering S12 of the time-series is performed for each time-instance of the time-series received, based on the different locations of the receivers. Thus, each spatially phased series is obtained S13 for each time-instance and comprises a series of signal values that correspond to signal sensed at a same time instance. In this case, the ordering S12 may be performed according to a predetermined order of the receivers, e.g., by identifying a sequence of receivers based on receivers' locations. Typically, a number of spatially phased series will subsequently be obtained according to that same predetermined order. One will typically keep on using that same order, unless the system is re-parametrized, e.g., to take into account new receivers, new locations, or any relevant change in the set of receivers. Only one spatially phased series is typically obtained at each time instance.

The ordering of the time-series is preferably based on distances between the different locations of the receivers 410, 510, 610. The ordering S12 may for instance be performed by identifying a sequence of receivers, by successively picking closest receivers, such that the n+1$^{th}$ receiver of the sequence is the closest receiver from the n$^{th}$ receiver of the sequence. This way, one minimizes distances between locations corresponding to contiguous pairs of elements in each of the spatially phased series. In practice, such a sequence may be identified based on pair distances.

For example, the algorithm may proceed as follows. A first receiver location $L_1$ is picked-up, which is assumed to be at the origin and corresponds to one particular receiver (conveniently called $R_1$) of a set of N receivers. Then, a closest receiver location $L_2$ is identified, which is distinct from $L_1$ and corresponds to a second receiver of the set, denoted by $R_2$. A next closest receiver location $L_3$ is then identified (distinct from each of $L_1$ and $L_2$), and so on. An order can thus be established, S12, based on physical locations (i.e., geographical positions) of the receivers, which locations may typically be set in a 2D or 3D space.

Assume now that each receiver collects only one value at each time instance, for simplicity. The signals sensed by each receiver $R_i$ at location $L_i$ are converted into time-series $c_i(t)$ and provided to a suitable computerized unit, e.g., a denoising unit (or denoiser for short) 430, 530, 630 (FIGS. 4-6), for the latter to perform the following operation.

For a given time instance, e.g., $t=t_j$, a spatially phase series $\tilde{x}_j=x(t_j)$ is obtained S13, such that $\tilde{x}_j=\{c_1(t_j), c_2(t_j), \ldots, c_N(t_j)\}$ and the same ordering is kept for each subsequent time series (unless, of course, the denoiser is re-parametrized). In this example, the space-series are spatially-phased (due to the different locations of the receivers) but no additional time shift is imposed in the spatially phase series $\tilde{x}_j$. I.e., two contiguous elements $c_k(t_j)$, $c_{k+1}(t_j)$ of the series correspond to signal sensed by two closest receivers of the set $\{k, \ldots, N\}$ at a same time instance $t_j$, according to the ordering performed at step S12. Other ordering strategies may be implemented, which may be more or less sophisticated. In all cases, this ordering will be based on locations of the receivers.

However, as evoked above, additional time shift may be imposed in the spatially phase series $\tilde{x}_j$ as obtained at the end of step S13. That is, the series obtained may include additional time shifts, in addition to the spatial phase resulting from the location-based ordering. A simple example is one where time-series are buffered for M successive time points and the space-time series obtained are simple time shifts of the previous example, whereby $\tilde{x}_j=\{c_1(t_j), c_2(t_{j-1}), \ldots, c_N(t_{j-M})\}$. In this example, two contiguous elements $c_k(t_{j'})$, $c_{k+1}(t_{j'-1})$ of the series correspond to signal sensed by two closest receivers of the set $\{k, \ldots, N\}$ at two distinct (but contiguous) time instances. Of course, more sophisticated algorithms may be involved, depending on the problem to be solved. It may for instance be needed to impose particular time shifts, due to large separation distances between the receivers and the finite propagation speed of the signal meant to be detected, as in (radio) astronomy applications. In general, additional time shift may be imposed in the spatially phase series $\tilde{x}_j$ as obtained at the end of step S13 by selecting time-series elements that correspond to two or more different time instances and then ordering the time-series elements selected, according to the locations of the receivers.

In addition, if more than one values are to be collected by some or each of the receivers at each time instance, then the problem can be linearized, by considering each receiver concerned as several receivers. In that respect, we note that different observations made by one receiver at a same instant may correspond to different physical locations within that receiver (as in multi-pixel sensors, whose pixels are at different locations). In such cases, linearization is all the more appropriate.

As evoked earlier, the method may further comprises a step of reconstructing S17 an estimate of a true signal according to the denoised, spatially phased series obtained S16. This step need not be locally performed, e.g., by a denoiser 430, but may be performed by another computerized unit 450 or module, which may collect denoised series as obtained at step S16, for one or more, or each time instance, to that aim.

Figure 2:
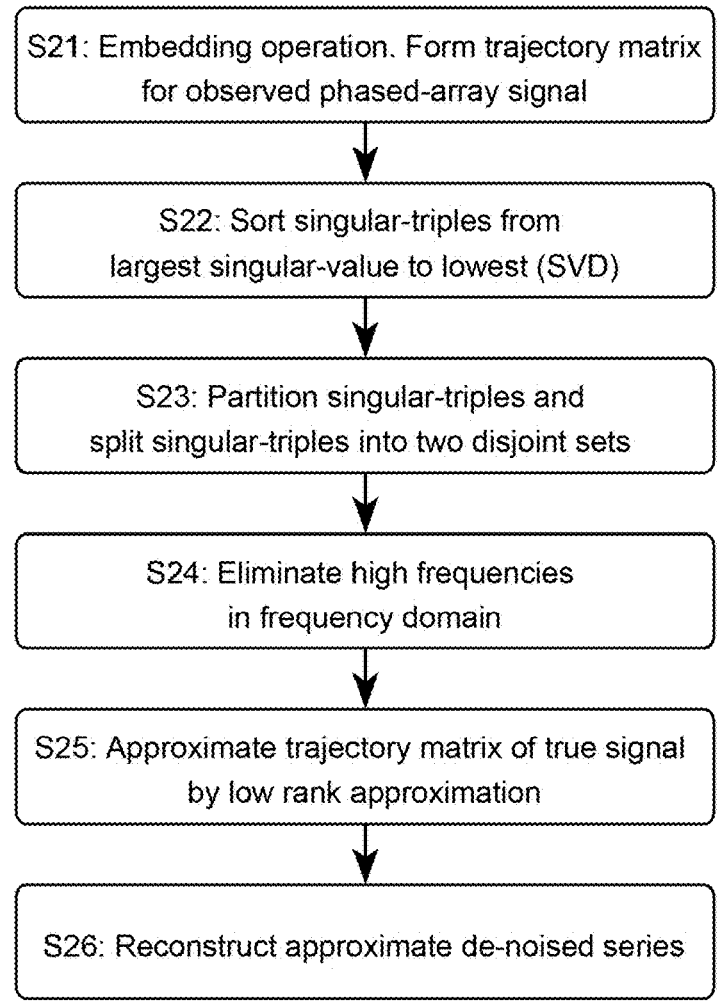
FIG. 2 is a flowchart illustrating steps of a modified singular spectrum analysis, which can be used as part of the method of FIG. 1, in embodiments.

Referring now to FIGS. 1 and 2, in embodiments, the identification S14 and removal S15 of the noise components may advantageously be performed according to steps of a singular spectrum analysis (SSA) technique S21-S26. The basic SSA algorithm is known to involve four steps, namely an embedding step, a Singular Value Decomposition (or SVD), a so-called Eigentriple grouping step, and a diagonal averaging.

General principles of the basic SSA are echoed in steps S21, S22, S23 and S26 of FIG. 2, although such steps may typically need be adapted to the context. In particular, the basic SSA analysis S21-S26 may advantageously include an additional step S24, which aims at eliminating S24 highest frequencies. I.e., frequencies above a given threshold in singular-vectors of one of two disjoint sets of singular triples may need be discarded. The set of singular triples concerned is the set that comprises the lowest singular-values. This additional step S24 is performed prior to reconstruct S26 approximate de-noised, spatially phased series. This step S24 impacts the subsequent step S25 (low-rank approximation, FIG. 2), wherein a trajectory matrix of the true signal is approximated. Yet, step S25 may be regarded as being part of the final reconstruction step S26.

The additional step S24 is all the more advantageous when the noise is believed to be substantial, even much larger than the true signal so to distinguish noise and true signal easily. All this shall be explained in detail in the next sections. Yet, we note that the modified SSA techniques used herein are optional, inasmuch as other denoising techniques may be contemplated, depending on the problem at stake, as the skilled person will appreciate. Cadzow denoising, for instance, performs well when noise has low power. Basic SSA is also used to denoise high SNR signals. Note that the steps in FIG. 2 are not independent from the general flowchart of FIG. 1. Rather, steps S14-S16 of FIG. 1 may, in embodiments, be implemented as steps S21-26 of the particular embodiment of FIG. 2.

Figure 4:
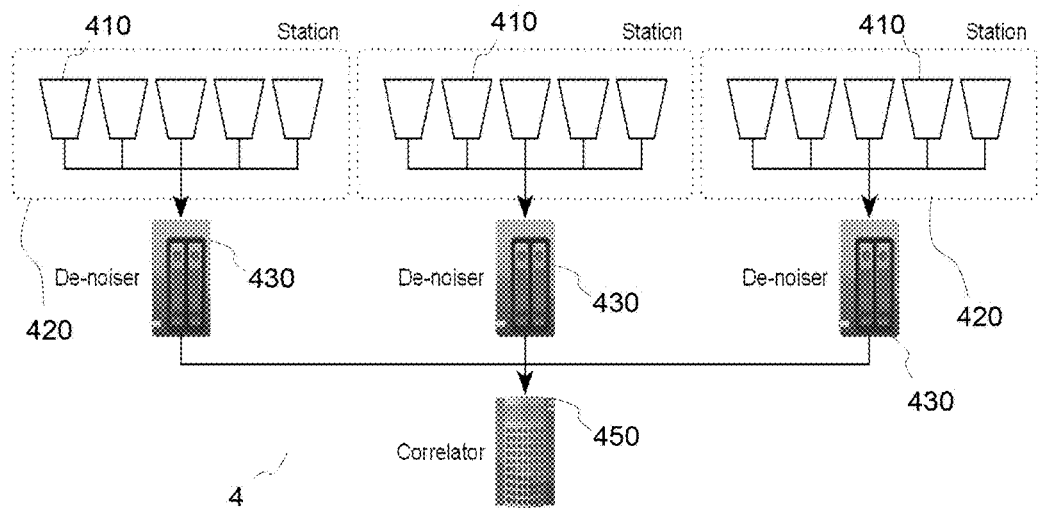
FIG. 4 schematically depicts a radio interferometry system, whose receivers are antennas grouped in stations, according to embodiments.
Figure 5:
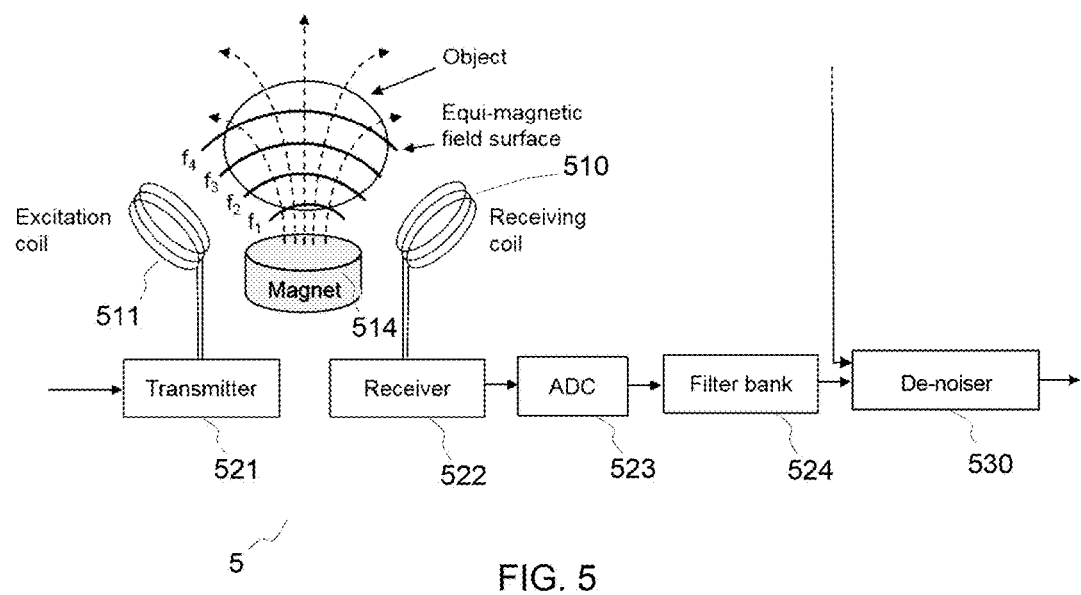
FIG. 5 schematically represents a magnetic resonance imaging system, according to embodiments.
Figure 6:
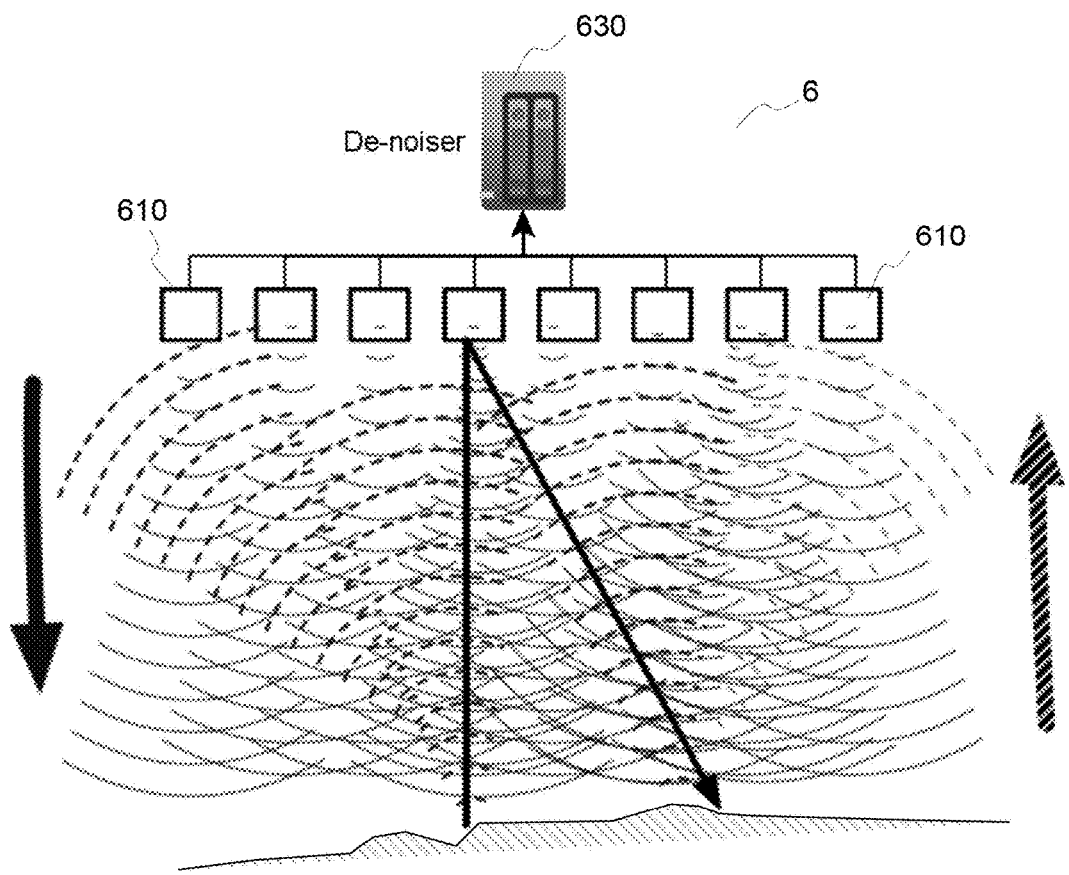
FIG. 6 schematically depicts an ultrasound apparatus, according to embodiments.

Referring now to FIGS. 4-6, and according to another aspect, the invention can be embodied as a receiver system 4-6. Such a system basically comprises a set of receivers 410, 510, 610 (located at different locations), wherein each of the receivers 410, 510, 610 is configured to convert signals it receives into time-series. The system 4-6 further comprises one or more denoisers (or modules) 430, 530, 630, which are connected to the receivers 410, 510, 610. Each denoiser is configured to implement steps S11-S16 as described above in reference to the present methods.

Depending on the context, step S17 may be performed at the same denoisers 430, 530, 630 or modules that implement steps S11-S16, or at one or more connected units 450, 550, 650 or modules operatively connected to the former.

One or more denoisers 430, 530, 630 may indeed be involved. For example, in radio interferometry applications (FIG. 4), it may be advantageous to provide at least one denoiser 430 per station. In other applications, one may use one denoiser for a subset of the receivers (as assumed in FIG. 5), or one central denoiser (FIG. 6), acting for all receivers. In fact, many possible configurations may be contemplated, ranging from a few-to-one mapping between receivers and denoisers, to a unique denoiser connected to all receivers to denoise signals therefrom, as illustrated in FIGS. 4-6.

For example, in the embodiment of FIG. 4, the system is a radio interferometry system 4 and the receivers are radio astronomy antennas 410, which are grouped in stations 420 in the system 4. In such a case, the system 4 preferably comprises (at least) one denoiser 430 per station, connected to each of the receivers of a station. It may, however, be preferable to provide more than one denoiser per station if antennas are scattered, geographically, even within a same station.

In all cases, the ordering S12 of the time-series is performed based on the different locations of the antennas 410, according to principle already discussed in reference to FIG. 1. Yet, and contrary to the prior art approaches, the noise reduction is performed at antenna-level here, i.e., prior to beamforming. In that respect, additional beamforming operations may be involved, as usual in interferometry applications. In particular, the denoised, spatially phased series as obtained at the end of step S16 or step S26 may be subsequently summed (step S31, FIG. 3), at the level of each station 420, using beamforming techniques, to obtain beam-formed outputs. Then, correlation values may then be obtained S32, according to the beamformed outputs obtained at step S31. Steps S31 may be performed by one or more entities 450.

Referring now to FIG. 5, in embodiments, the system is a MRI system 5 and the receivers are radiofrequency coils 510 of this MRI system 5. The present methods may indeed be applied to signals received from a set of radiofrequency coils 510, 511 (only one such set is depicted in FIG. 5, for simplicity). Similarly, the system 5 may be a nuclear magnetic resonance (NMR) spectroscopy system. In MM or NMR applications, a magnetic resonance (MR) transceiver 521-522 typically generates 521 wideband excitation signals that are sent to one or more excitation-coils 511 in consecutive measurement bursts, and processes signals received 522 after each burst from one or more receiving coils 510 to detect narrowband signals at the output of subchannels of a filter bank 524, after analog-to-digital conversion 523. The position of the magnet 514 is usually modified after each measurement to differentiate the spectral contributions to the received signal from each volume element. Thus, a denoiser 530 may here be implemented as part of the filter bank or after a classical bank 524, as assumed in FIG. 5. The denoiser will, in all cases, operate on series obtained S13 by re-ordering S12 time series received S11 from two or more receiving coils.

In other embodiments, the present methods may be applied to signals received from arrays of transducers 610 of an ultrasound apparatus 6 and the present systems may include such an apparatus 6. The signals received may be processed by a denoiser 630, e.g., in a central fashion. Yet, depending on the number and locations of the transducers 610, several denoising units may be desired. More generally, the present methods and systems may be directed to a sensor network.

Finally, the present invention may be implemented as a computer program product. This will be discussed in detail in sect. 5.

The above embodiments have been succinctly described in reference to the accompanying drawings and may accommodate a number of variants. Several combinations of the above features may be contemplated. Examples are given in the next sections.

2. Modified Singular Spectrum Analysis Techniques Used in Embodiments

Prior art denoising methods are typically only able to handle low noise relative to signal power. In contrast to such approaches, embodiments of the present invention can be applied to remove high noise from phased-array signals at a specific time-instance.

Ref [1], see the background section, describes two non-parametric and model-free methods commonly used to reduce the noise from observations (i.e., the so called Cadzow's basic algorithm and the basic Singular Spectrum Analysis, or SSA). Both methods are closely related to alternating projections. The main assumption behind both methods is that the series can be represented as a sum of different components such as trend, harmonics and noise, see also ref. [2]. These methods perform noise reduction in any series under high signal-to-noise ratio.

Generally speaking, methods based on singular value decomposition (SVD) do not offer the possibility to remove high noise in the series. In addition, the existing methods for noise reduction in phased-arrays does not offer very accurate results.

As discussed in the previous section, embodiments of the present invention involve SVD-like techniques to significantly reduce the noise in phased-arrays in presence of very high instrumental noise. Such techniques are now discussed in more detail.

Figure 7A:
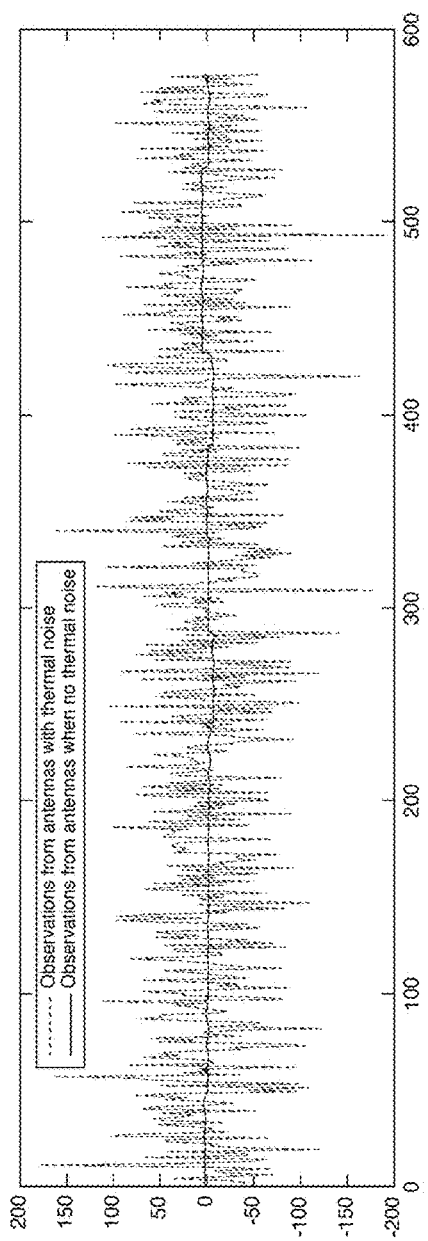
FIGS. 7A and 7B are plots of an example of signal that includes thermal noise, the corresponding true signal (without thermal noise) and an estimate of the true signal reconstructed according to an embodiment of the present methods.

The true phased-array signal shape usually disappears in presence of instrument noise, see FIG. 7A. Yet, embodiments of the present invention provide a solution to significantly reduce the noise in the observed phased-array signal with high accuracy. This can be achieved by exploiting two properties of such systems. As it may be realized: (a) the instrument noise is very high relative to the true phased-array signal; and (b) the true phased-array signal is slowly varying.

Such embodiments employ an SSA technique so as to split the observed phased-array signal into true signal and noise components. The underlying methods are thus closely associated to the structured low-rank approximation problem. They include particular filtering operations in singular spectrum of a suitably chosen projection space.

In reference to FIG. 2, the modified SSA steps used can be the following:

Embedding, step S21 forms a trajectory matrix $\tilde{X}$ of the observed phased-array signal $\tilde{x}$;

Singular Value Decomposition; step S22 sorts singular-triples $(u_n, \sigma_n, v_n)$ for $n \in \{1, \ldots, L\}$ from the largest singular-value to the lowest, i.e., $\sigma_1 \geq \ldots \geq \sigma_L \geq 0$;

Grouping: step S23 partitions the set of singular-triples $\mathcal{J}$. A threshold $\tau \in \mathbb{R}^+$ is set on singular-values and the singular-triples are split into two disjoint sets $\mathcal{J}_1$ and $\mathcal{J}_2$ such that $\forall a \in \mathcal{J}_1$ and $b \in \mathcal{J}_2$, $\sigma_a \geq \sigma_b$;

Eliminating high frequencies: step S24 analyses and filters in the frequency domain. A threshold $\omega \in [0, 2\pi)$ is set on the frequency band and a low-pass filter applied with cutoff frequency ω to $u_n$ and $v_n$ $\forall n \in \mathcal{I}_2$.
The filtered singular-vectors are denoted by $\hat{u}_n$ and $\hat{v}_n$;

Decomposition (low-rank approximation): step S25 approximate the trajectory matrix $\hat{X}$ of the true signal by $\Sigma_{b \in \mathcal{I}_2} \hat{u}_b \sigma_b \hat{v}_b^T$; and Diagonal averaging: step S26 reconstructs the approximated de-noised series $\hat{x}$ by applying the inverse of the embedding operation to $\hat{X}$.

3. Properties

Roughly speaking, the SSA technique presented in the previous section separates components associated with the true signal and components associated with noise. It is all the more suited if the following conditions are fulfilled:

The noise should be high relative to the true signal power;
The noise and the true signal should be approximately separable; and
The noise and the true signal should be distinguishable.

The first of these conditions is an additional necessary condition set for distinguishability, while the other two conditions follow from the same discussion as in basic SSA. Let $\hat{x}_j$ denote the ordered sequence of samples as obtained by ordering time-series from a set of receivers at step S13, at a specific time $t_j$. Such receivers may for instance be closely located antennas. Thus, we have:

$$\hat{x}_j = x_j + n_j, \quad (1)$$

where $x_j$ and $n_j$ correspond to the sequence and the corresponding noise sequence at $t_j$, respectively. Generally, thermal noise is statistically independent from the true signal and among different receivers, which in turn implies that noise and true signal are approximately separable.

As implied before, low signal-to-noise ratio and slow-varying property of the true signal are significantly prior information in the present method. Both properties impact the distinguishability requirement set forth above. We exploit high thermal noise property to eliminate $\mathcal{I}_1$ since the high valued singular-values set belongs to the noise component. Note that $\mathcal{I}_2$ includes true signal and high frequency components of the noise followings:

$\mathcal{I}_1$ is leading to $\mathcal{I}_2$ by definition; and
Trend is in leading singular-triples.

Hence, eliminating high frequencies in singular-vectors in $\mathcal{I}_2$ followed by the steps S25 (decomposition) and S26 (diagonal averaging) will give the trend of the true signal, which may, in turn, even be equivalent to the true signal, owing to the slow-varying property of the true signal.

Finally, we note that the approximate separability condition still holds due to independence between noise and true signal.

4. Detailed Description of Particular Embodiments 4.1 Radio Astronomy

Figure 3:
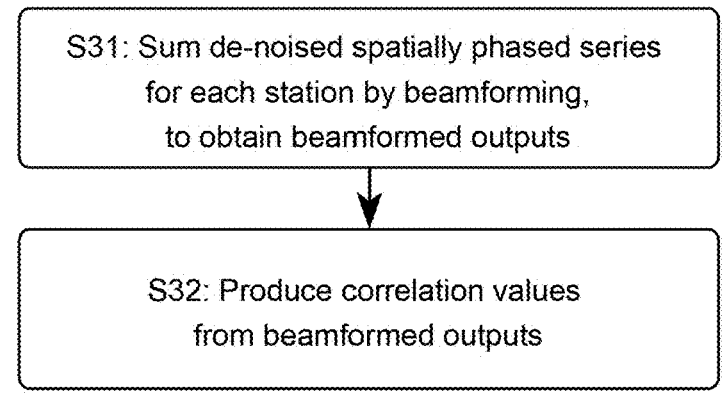
FIG. 3 is a flowchart illustrating additional steps to obtain beamformed outputs and correlation values, as in embodiments directed to interferometry applications.

Modern radio telescopes correlate the signals measured by thousands of antennas at various locations on the ground, in order to infer an image of the sky. To reduce the amount of data sent to a central processor and increase the signal-to-noise ratio, closely-located antennas are grouped together in stations (FIG. 4) and beamformed (FIG. 3). One of the main challenges that radio astronomy interferometers faces is the very high instrument noise relative to signal power, which, in turn, leads to noisy images. The usual technique for recovery of the sky image is to produce many correlator outputs to overcome the noise, and to use those outputs, after calibration, to ascertain an image. However, noise reduction has not been processed at antenna level so far. To cope with the non-coherent thermal noise introduced by the antennas, embodiments of the invention offer an efficient and accurate method of noise reduction.

Thus, a preferred embodiment in radio astronomy is, for a given collection of antennas, to:

Order S12 the series of observations taken S11 from antennas geographically, at each time-instance, to obtain S13 spatially-phased series;
Pass these through the denoising filter described above, steps S21-S26 (S14-S16); and
Reconstruct S17 the desired signal by:
Summing S31 de-noised series at station level by beamforming; and
Producing S32 correlation values from the beamformed outputs.

Figure 7B:
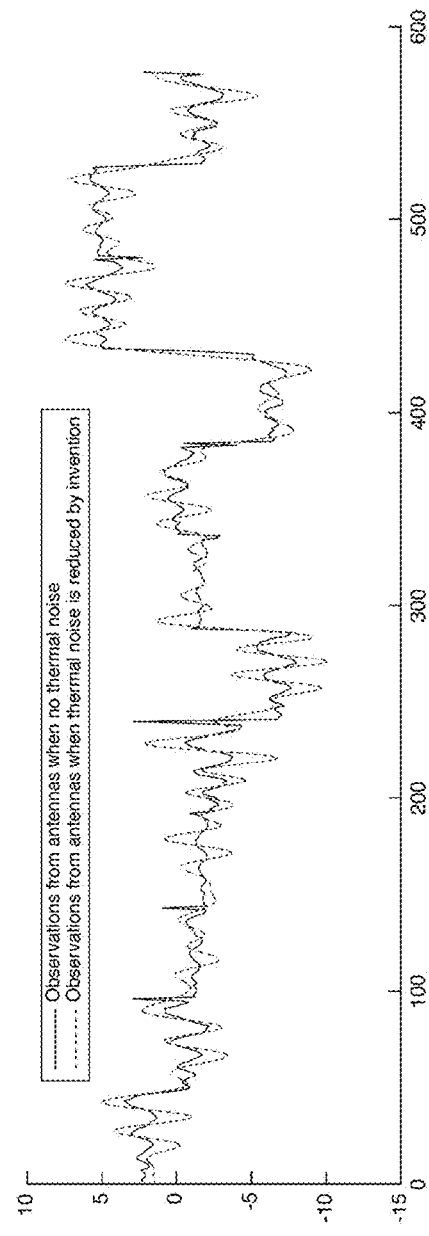

FIGS. 7 and 8 illustrate the application of embodiments of the invention in radio astronomy on sky images. A case study on the performance of such embodiments applied to antenna observations is given in FIG. 1. Namely, FIGS. 7A and 7B show series of observations taken from geographically close antennas. The above method is applied to antenna observations within each station (dashed line, FIG. 7B). FIG. 7A compares antenna observations that include thermal noise with antenna observations when no thermal noise is present (as obtained from a synthetic data set). FIG. 7B demonstrates that the noise can be significantly reduced.

Figure 8A:
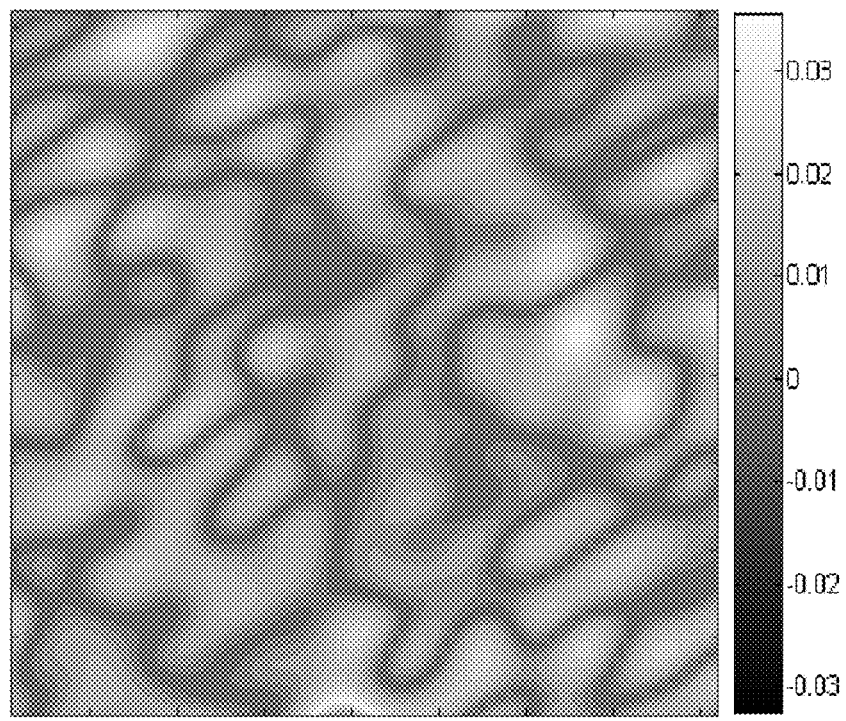
FIGS. 8A and 8B are density plots that represent differences between, on the one hand, a true signal (without thermal noise) and an estimate thereof as reconstructed using a conventional, prior art method (FIG. 8A) and, on the other hand, an estimate as reconstructed according to an embodiment of the present methods (FIG. 8B)
Figure 8B:
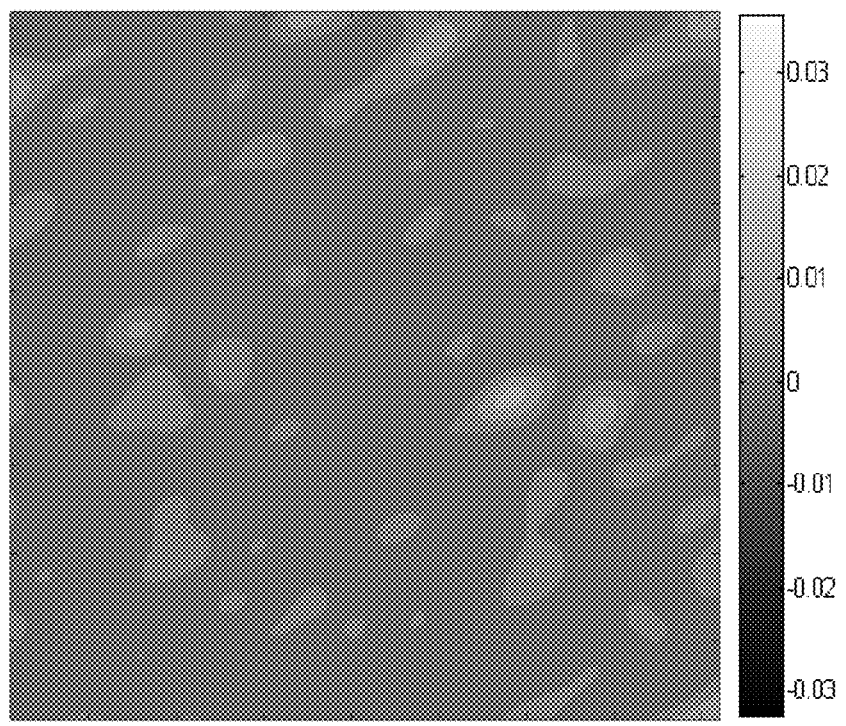

FIGS. 8A and 8B represent differences (as density plots) between a true signal (without thermal noise) of a sky image and, on the one hand, an estimate thereof as reconstructed without denoising at all (FIG. 8A) and, on the other hand, an estimate as reconstructed according to an embodiment (FIG. 8B). It is clear that the denoising obtained according to such an embodiment dramatically improves performance.

4.2 Medical Imaging

Ultrasound consists of arrays of transducers. When the data is received by the transducers, the resultant image is very noisy. Embodiments of the invention can help to remove this noise. The potential benefits of such embodiments for ultrasound applications include more accurate images (noise is removed) and a lower number of necessary transducers, which, in turn, enable low-cost and portable devices.

A preferred embodiment of the present methods for denoising the time-series received from the transducers, comprises the following steps (FIGS. 1, 2 and 6):

Pick an appropriate ordering of the transducers 610, S12, to obtain S13 slowly-varying, spatially phased series; and
At each time instant, pass the digitally sampled transducer values of the spatially phased series through the denoiser 630, steps S21-S26 (S14-S16); and
Pass the denoised values for further processing, to reconstruct S17 the desired signal.

MRI systems are moving to using more and more coils in parallel, thereby acting as a phased-array [3]. For a given set of receiving coils, preferred embodiments follow a procedure similar to that used in the ultrasound case.

4.3 General Time-Series Observing Sensor Networks

A sensor network such as those used in "smart-cities" initiatives for monitoring water pressure, temperature, etc., can be regarded as a phased array, whose data would benefit from denoising methods as discussed in section 1. In correlating devices connected in an "internet-of-things", such methods may provide crucial benefits by denoising the numerous signals collected.

5. Technical Implementation Details 5.1 Computerized Systems and Devices

Computerized systems and devices can be suitably designed for implementing embodiments of the present invention as described herein. In that respect, it can be appreciated that the methods described herein are largely non-interactive and automated. In exemplary embodiments, the methods described herein can be implemented either in an interactive, partly-interactive or non-interactive system. The methods described herein can be implemented in software, hardware, or a combination thereof. In exemplary embodiments, the methods described herein are implemented in software, as an executable program, the latter executed by suitable digital processing devices. More generally, embodiments of the present invention can be implemented wherein general-purpose digital computers, such as personal computers, workstations, etc., are used.

Figure 9:
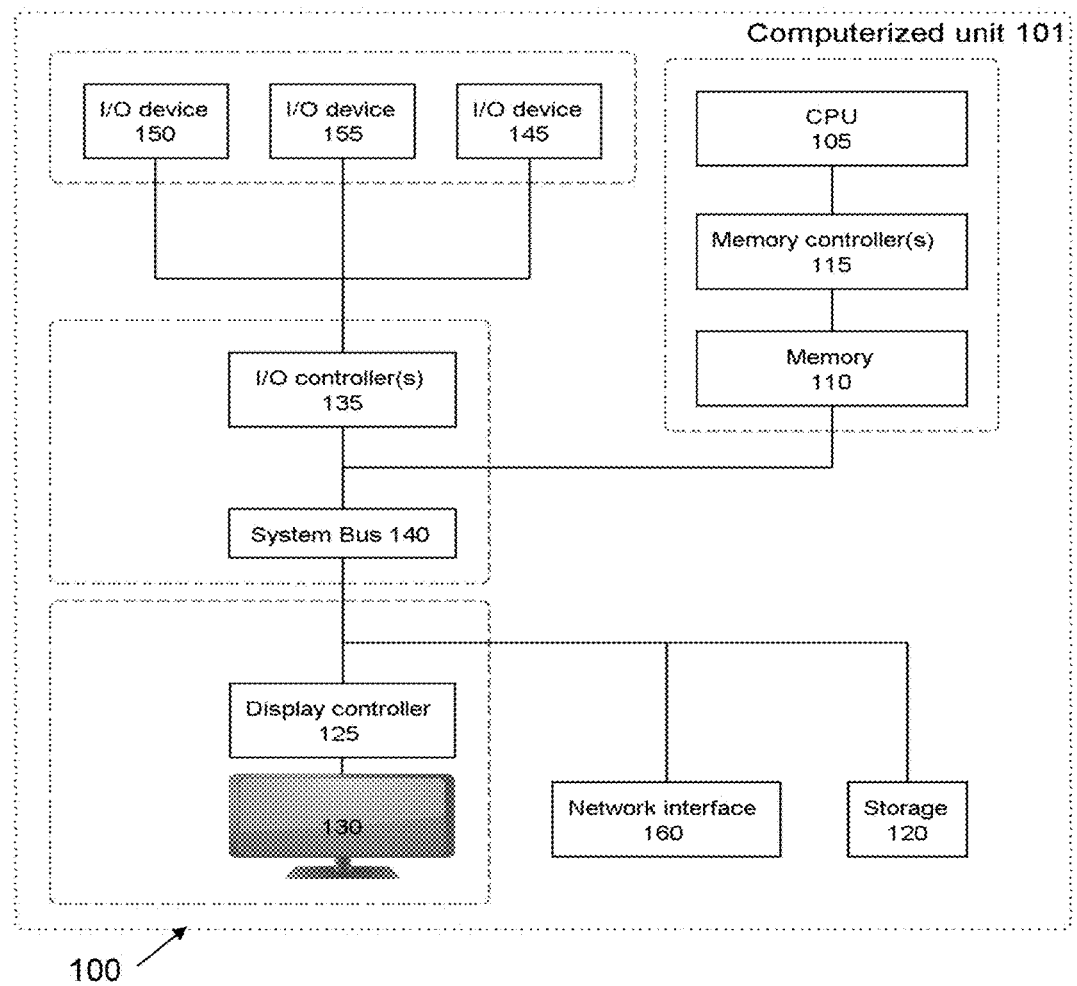
FIG. 9 schematically represents a general purpose computerized system, which can for example be configured as a de-noising unit, for implementing one or more method steps as involved in embodiments.

For instance, the system 100 depicted in FIG. 9 schematically represents a computerized unit 101, e.g., a general- or specific-purpose computer, which may be used in place or as part of the devices 430, 450, 530, 630 described earlier. As such, the unit 101 may interact with receivers (or transceivers, transducers) 410, 510, 610, e.g., via converters and I/O units 145-155.

In exemplary embodiments, in terms of hardware architecture, as shown in FIG. 9, the unit 101 includes a processor 105, memory 110 coupled to a memory controller 115. One or more input and/or output (I/O) devices 145, 150, 155 (or peripherals) are communicatively coupled via a local input/output controller 135. The input/output controller 135 can be coupled to or include one or more buses and a system bus 140, as known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), or generally any device for executing software instructions.

The memory 110 can include any one or combination of volatile memory elements (e.g., random access memory) and nonvolatile memory elements. Moreover, the memory 110 may incorporate electronic, magnetic, optical, and/or other types of storage media. Note that the memory 110 can have a distributed architecture, where various components are situated remote from one another, but can be accessed by the processor 105.

The software in memory 110 may include one or more separate programs, each of which comprises an ordered listing of executable instructions for implementing logical functions. In the example of FIG. 9, the software in the memory 110 includes methods described herein in accordance with exemplary embodiments and, in particular, a suitable operating system (OS) 111. The OS 111 essentially controls the execution of other computer programs and provides scheduling, input-output control, file and data management, memory management, and communication control and related services.

The methods described herein may be in the form of a source program, executable program (object code), script, or any other entity comprising a set of instructions to be performed. When in a source program form, then the program needs to be translated via a compiler, assembler, interpreter, or the like, as known per se, which may or may not be included within the memory 110, so as to operate properly in connection with the OS 111. Furthermore, the methods can be written as an object oriented programming language, which has classes of data and methods, or a procedure programming language, which has routines, subroutines, and/or functions.

Possibly, a conventional keyboard and mouse can be coupled to the input/output controller 135. Other I/O devices 140-155 may include or be connected to other hardware devices 10, as noted earlier.

In addition, the I/O devices 140-155 may further include or be connected to devices 410, 510, 610 that communicate outputs, e.g., time series. The system 100 can further include a display controller 125 coupled to a display 130. In exemplary embodiments, the system 100 can further include a network interface or transceiver 160 for coupling to a network 165, to enable, in turn, data communication to/from other, external components.

The network 165 transmits and receives data between the unit 101 and external systems. The network 165 is possibly implemented in a wireless fashion, e.g., using wireless protocols and technologies, such as Wifi, WiMax, etc. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

The network 165 can also be an IP-based network for communication between the unit 101 and any external server, client and the like via a broadband connection. In exemplary embodiments, network 165 can be a managed IP network administered by a service provider. Besides, the network 165 can be a packet-switched network such as a LAN, WAN, Internet network, an Internet of things network, etc.

If the unit 101 is a PC, workstation, intelligent device or the like, the software in the memory 110 may further include a basic input output system (BIOS). The BIOS is stored in ROM so that the BIOS can be executed when the computer 101 is activated. When the unit 101 is in operation, the processor 105 is configured to execute software stored within the memory 110, to communicate data to and from the memory 110, and to generally control operations of the computer 101 pursuant to the software.

The methods described herein and the OS 111, in whole or in part are read by the processor 105, typically buffered within the processor 105, and then executed. When the methods described herein are implemented in software, the methods can be stored on any computer readable medium, such as storage 120, for use by or in connection with any computer related system or method.

5.2 Computer Program Products

The present invention may be an apparatus, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the C programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other applications than those explicitly mentioned may benefit from denoising methods as described herein.

What is claimed is:

1. A computerized method to reduce noise in phased-array signals from a set of receivers at different locations, wherein the method comprises:

receiving time-series from the receivers, the time-series forming phased-array signals;

ordering the time-series based on the different locations of the receivers and obtaining, from the ordered time-series, spatially phased series, wherein each of the spatially phased series obtained comprises a series of signal values that are spatially phased; and identifying a noise component in each of the spatially phased series obtained and removing the identified noise component from said each of the spatially phased series obtained to obtain denoised, spatially phased series;

wherein:

said receivers comprise radio astronomy antennas grouped in stations;

said radio astronomy antennas introduce non-coherent thermal noise;

said ordering the time-series is performed based on the different locations of the antennas;

the method further comprises antenna-level noise reduction by:

summing denoised, spatially phased series obtained at a level of each of said stations by beamforming, to obtain beamformed outputs; and obtaining correlation values based on the beamformed outputs obtained.

2. A radio interferometry system, comprising:

a set of receivers at different locations, the receivers comprising radio astronomy antennas which are grouped in stations in the system and which introduce non-coherent thermal noise, each of the receivers configured to convert signals it receives into time-series;

a plurality of noise reduction units, at least one for each of the stations, the noise reduction units being connected to the corresponding receivers for each respective station and configured, each, to:

receive time-series from at least a subset of the receivers, the time-series forming phased-array signals;

order the time-series based on the different locations of said one or more of the receivers and obtain, from the ordered time-series, spatially phased series, wherein each of the spatially phased series obtained comprises a series of signal values that are spatially phased; and identify a noise component in each of the spatially phased series obtained and remove the identified noise component from said each of the spatially phased series obtained to obtain denoised spatially phased series; and a correlator which sums denoised, spatially phased series obtained at a level of each of said stations by beamforming, to obtain beamformed outputs, and obtains correlation values based on the beamformed outputs obtained.

3. A non-transitory computer readable medium comprising computer executable instructions which when executed by a computer cause the computer to perform a method for reducing noise in phased-array signals from a set of receivers at different locations, comprising:

receiving time-series from the receivers, the time-series forming phased-array signals;

ordering the time-series based on the different locations of the receivers and obtaining, from the ordered time-series, spatially phased series, wherein each of the spatially phased series obtained comprises a series of signal values that are spatially phased; and identifying a noise component in each of the spatially phased series obtained and removing the identified noise component from said each of the spatially phased series obtained to obtain denoised spatially phased series;

wherein:

said receivers comprise radio astronomy antennas grouped in stations;

said radio astronomy antennas introduce non-coherent thermal noise;

said ordering the time-series is performed based on the different locations of the antennas;

the method further comprises antenna-level noise reduction by:

summing denoised, spatially phased series obtained at a level of each of said stations by beamforming, to obtain beamformed outputs; and obtaining correlation values based on the beamformed outputs obtained.

* * * * *